(12) United States Patent
Chow et al.

(10) Patent No.: US 7,859,094 B2
(45) Date of Patent: Dec. 28, 2010

(54) INTEGRATED CIRCUIT PACKAGE SYSTEM FOR STACKABLE DEVICES

(75) Inventors: Seng Guan Chow, Singapore (SG); Rui Huang, Singapore (SG); Heap Hoe Kuan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 139 days.

(21) Appl. No.: 12/238,183

(22) Filed: Sep. 25, 2008

(65) Prior Publication Data
US 2010/0072597 A1 Mar. 25, 2010

(51) Int. Cl.
*H01L 23/02* (2006.01)
(52) U.S. Cl. ...................... 257/686; 257/777
(58) Field of Classification Search ............... 257/686, 257/777, 723, 724, 787
See application file for complete search history.

(56) References Cited
U.S. PATENT DOCUMENTS

| | | | |
|---|---|---|---|
| 5,394,010 A * | 2/1995 | Tazawa et al. | 257/686 |
| 6,075,710 A | 6/2000 | Lau | |
| 6,369,448 B1 | 4/2002 | McCormick | |
| 6,407,448 B2 | 6/2002 | Chun | |
| 6,424,031 B1 * | 7/2002 | Glenn | 257/686 |
| 6,555,917 B1 | 4/2003 | Heo | |
| 6,638,792 B2 | 10/2003 | Hui et al. | |
| 6,753,599 B2 * | 6/2004 | Kim | 257/686 |
| 6,768,190 B2 | 7/2004 | Yang et al. | |
| 6,815,254 B2 | 11/2004 | Mistry et al. | |
| 6,828,665 B2 | 12/2004 | Pu et al. | |
| 6,861,761 B2 | 3/2005 | Yang et al. | |
| 6,906,416 B2 | 6/2005 | Karnezos | |
| 7,026,709 B2 | 4/2006 | Tsai et al. | |
| 7,279,783 B1 | 10/2007 | Fjelstad et al. | |
| 7,285,850 B2 | 10/2007 | Poo et al. | |
| 7,298,033 B2 | 11/2007 | Yoo | |
| 7,310,458 B2 | 12/2007 | Wehrly, Jr. | |
| 7,355,274 B2 | 4/2008 | Lim | |
| 7,391,105 B2 | 6/2008 | Yeom | |
| 7,420,814 B2 | 9/2008 | Kim et al. | |
| 7,557,443 B2 | 7/2009 | Ye et al. | |
| 7,589,408 B2 | 9/2009 | Weng et al. | |
| 7,608,921 B2 | 10/2009 | Pendse | |
| 2003/0067082 A1 | 4/2003 | Moshayedi | |
| 2005/0133932 A1 | 6/2005 | Pohl et al. | |
| 2007/0059865 A1 | 3/2007 | Huang et al. | |
| 2007/0246815 A1 | 10/2007 | Lu et al. | |
| 2008/0090329 A1 | 4/2008 | Wehrly, Jr. | |
| 2008/0099890 A1 | 5/2008 | Chen et al. | |
| 2008/0111224 A1 | 5/2008 | Byun et al. | |
| 2009/0152740 A1 | 6/2009 | Park et al. | |

* cited by examiner

*Primary Examiner*—S. V Clark
(74) *Attorney, Agent, or Firm*—Mikio Ishimaru (57) ABSTRACT

An integrated circuit package system provides: forming a stack module including: providing a stack die and encapsulating the stack die with an insulating material having a protruding support and a pad connected to the stack die; mounting the stack module on a package base; connecting the pad to the package base; mounting a top die on the protruding support; connecting the top die to the package base; and encapsulating the top die, the package base, and the stack module with a package encapsulant.

16 Claims, 6 Drawing Sheets

INTEGRATED CIRCUIT PACKAGE SYSTEM FOR STACKABLE DEVICES

CROSS-REFERENCE TO RELATED APPLICATION(S)

The present application contains subject matter related to co-pending U.S. patent application Ser. No. 11/957,862 filed Dec. 17, 2007. The related application is assigned to STATS ChipPAC Ltd.

TECHNICAL FIELD

The present invention relates generally to integrated circuit packages and more particularly to integrated circuit package systems with stackable devices.

BACKGROUND ART

The integrated circuit package is the building block used in a high performance electronic system to provide applications for usage in products such as automotive vehicles, pocket personal computers, intelligent portable military devices, aeronautical spacecraft payloads, and a vast line of other similar products that require small compact electronics supporting many complex functions.

The integrated circuit package can include a package base or package substrate providing a mounting structure for attachment of at least one chip or die and an enclosure such as an epoxy applied on it to protect its contents. Typically, one side of the chip or die is used primarily for the mounting the chip or die.

The other side of the chip or die, referred to as an active surface of the chip or die, has electrically conductive areas that provide for electrical connections to its circuitry. Connectors, consisting of electrically conductive material, attach to the conductive areas to provide electrical connection between the circuitry of the chip or die and other circuitry not of the same chip or die.

The other circuitry can be from several possible sources. One possible source can be circuitry resident within the integrated circuit package, such as from another chip, indicative of a multiple chip integrated circuit package. Another possible source can be of circuitry residing outside the integrated circuit package such as from a printed circuit board within the electronic system.

Yet another possible source can be circuitry from one or more separate integrated circuit packages having one or more chips or dice within it. The separate integrated circuit packages can be connected with the conductors and enclosed together resulting in a single sealed package structure, or can be externally connected onto the single sealed package structure. Integrated circuit packages with small footprints and high internal IO connectivity are sought after for products with small printed circuit board systems. Global market demands also require solutions that provide lower costs and higher reliability through simplified manufacturing processing and early testing of circuitry for known good die (KGD) during fabrication which result in higher yield and improved circuitry reliability. Also, the leverage and flexibility provided by replacing package components as needed contribute to market leadership.

Attempts have failed to provide a complete solution addressing simplified manufacturing processing, smaller dimensions, lower costs due to design flexibility, reduced package counts, increased functionality, leveragability, and increased IO connectivity capabilities.

In view of the ever-increasing commercial competitive pressures, along with growing consumer expectations and the diminishing opportunities for meaningful product differentiation in the marketplace, it is critical that answers be found for these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system for stackable devices that includes: forming a stack module including: providing a stack die, and encapsulating the stack die with an insulating material having a protruding support and a pad connected to the stack die; mounting the stack module on a package base; connecting the pad to the package base; mounting a top die on the protruding support; connecting the top die to the package base; and encapsulating the top die, the package base, and the stack module with a package encapsulant.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGS.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Figure 1:
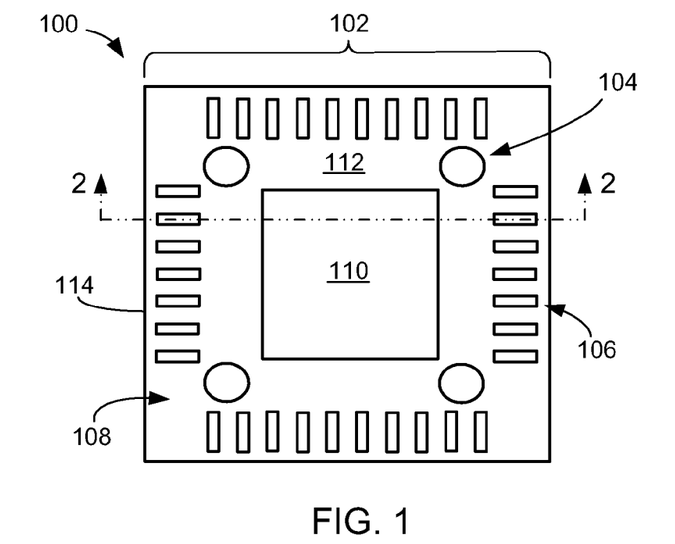
FIG. 1 is a top view of an integrated circuit package system in a first embodiment of the present invention.

Referring now to FIG. 1, therein is shown a top view of an integrated circuit package system 100 in a first embodiment of the present invention. The integrated circuit package system 100 can preferably include a stack module 102, such as an internal stacking module, having protruding supports 104, pads 106, a top surface 108, and an attachment layer 110.

The stack module 102 can be rectangular in shape with the top surface 108 consisting of an insulating material 112 such as an encapsulant with the protruding supports 104 on the top surface 108. The protruding supports 104 can be formed using the insulating material 112 or with material having similar structural and isolation properties. The pads 106, such as bonding pads, leads, or similar propertied material, can be located adjacent sides 114 of the stack module 102 and exposed adjacent the insulating material 112. The attachment layer 110, rectangular in shape, can be located centrally and exposed adjacent the insulating material 112 of the stack module 102.

The protruding supports 104 can be located at a predetermined distance from each corner of the stack module 102. It is noted that the protruding supports 104 could optionally be located anywhere on the top surface 108 adjacent the pads 106 or the attachment layer 110. The protruding supports 104 are shown having a circular shape and it is noted the shape, the size, or the quantity of the protruding supports 104 are non-restrictive and can be modified based on end user product requirements.

Figure 2:
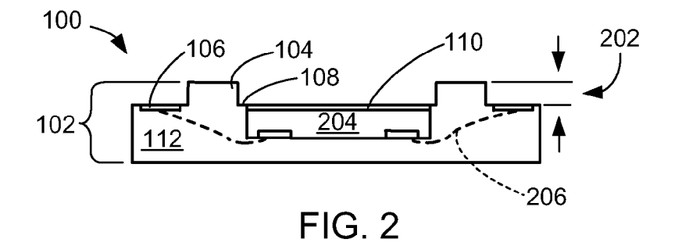
FIG. 2 is a cross-sectional view of the integrated circuit package system taken along a line 2-2 of FIG. 1.

Referring now to FIG. 2, therein is shown a cross-sectional view of the integrated circuit package system 100 taken along a line 2-2 of FIG. 1. The protruding supports 104 can be used to support and mount components such as devices or packages. The protruding supports 104 can be formed to rise a pre-determined vertical distance 202 above the top surface 108 to accommodate clearance specific connectivity requirements, such as restrictive wire loop heights or solder heights, when connecting to any of the pads 106 on the stack module 102 or with any components mounted above the stack module 102.

Within the insulating material 112, a stack die 204 can be located below the attachment layer 110 and connectivity between the circuitry of the stack die 204 and the pads 106 can be provided with interconnects 206 such as bond wires or similar electrical conductors located beneath the top surface 108.

The stack module 102 can preferably be further incorporated into a next level of integration as one or part of a series of modules joined to form a single integrated circuit package.

It has been found that vast improvements in yield and costs occur as the result of early testing to guarantee and certify the stack module 102 as "known good package" units prior to the next level of package integration and assembly.

Figure 3:
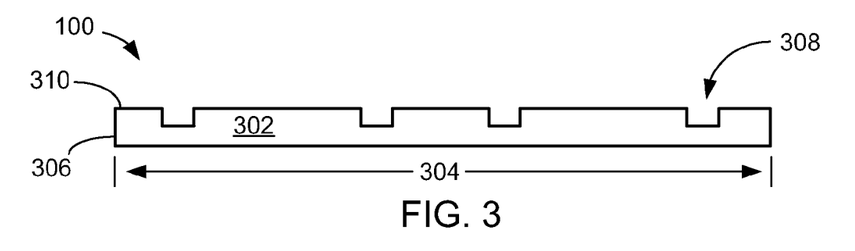
FIG. 3 is a cross-sectional view of the integrated circuit package system in a carrier formation phase of the present invention.

Referring now to FIG. 3, therein is shown a cross-sectional view of the integrated circuit package system 100 in a carrier formation phase of the present invention. A carrier 302 is shown having a pre-determined length 304 between outer edges 306. The pre-determined length 304 as-well-as width of the carrier 302 can be selected to produce one to any number of replications of the stack module 102. For purposes of illustration, the pre-determined length 304 and the width of the carrier 302 is chosen to illustrate a typical process flow that can be used for the manufacturing of two replicas of the stack module 102 of FIG. 1.

The carrier 302, rectangular in shape, can include material such as copper foil, aluminum foil, dummy silicon, or any other acceptable carrier material. Cavities 308, having a cylindrical profile can be formed adjacent a top surface 310 of the carrier 302 using methods such as photo patterning and etching processes or any other method suitable for usage on the carrier material.

The cavities 308 can each be formed adjacent each corner of the carrier 302 and adjacent four corners created by the intersection of the outer edges 306 and of a reference line formed on the top surface 310 perpendicularly bisecting the length of the carrier 302.

Figure 4:
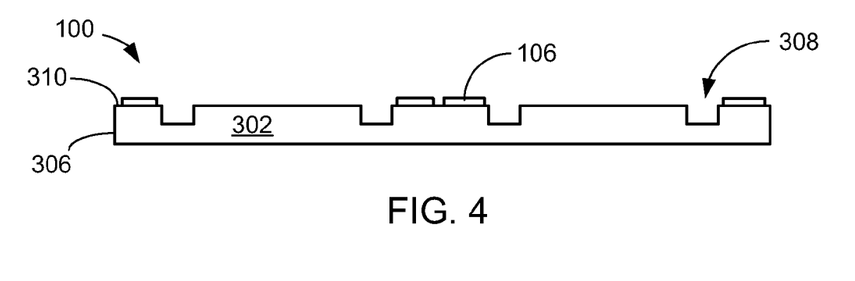
FIG. 4 is the structure of FIG. 3 in a pad formation phase.

Referring now to FIG. 4, therein is shown the structure of FIG. 3 in a pad formation phase. The carrier 302 can include the pads 106 formed on the top surface 310 between the outer edges 306 of the carrier 302 and the cavities 308 adjacent the outer edges 306. The pads 106 can also be formed on the top surface 310 between the reference line formed on the top surface 310 perpendicularly bisecting the length of the carrier 302 and the cavities 308 closest each side of the reference line. The pads 106 can be formed using a photo patterning and electroplating process or any other process method compatible with the selected technology.

Figure 5:
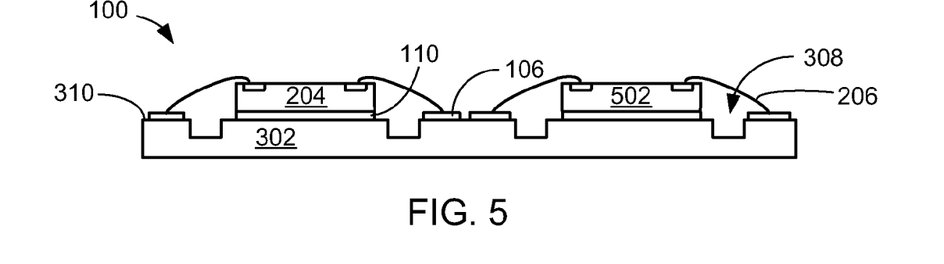
FIG. 5 is the structure of FIG. 4 in a connection phase.

Referring now to FIG. 5, therein is shown the structure of FIG. 4 in a connection phase. The carrier 302 can preferably include the stack die 204 and an array die 502. The stack die 204 can be positioned over the top surface 310, left of the reference line formed on the top surface 310 perpendicularly bisecting the length of the carrier 302 and centrally located within a perimeter consisting of the cavities 308 within the left side.

The array die 502, such as another of the stack die 204 of FIG. 2, can be positioned over the top surface 310, right of the reference line formed on the top surface 310 perpendicularly bisecting the length of the carrier 302 and centrally located within a perimeter consisting of the cavities 308 within the right side. The stack die 204 and the array die 502 can be mounted on the top surface 310 using the attachment layer 110.

One or more of the pads 106 located left of the reference line formed on the top surface 310 perpendicularly bisecting the length of the carrier 302 can be electrically connected to the circuitry of the stack die 204 using the interconnects 206. One or more of the pads 106 located right of the reference line formed on the top surface 310 perpendicularly bisecting the length of the carrier 302 can be electrically connected to the circuitry of the array die 502 using the interconnects 206.

Figure 6:
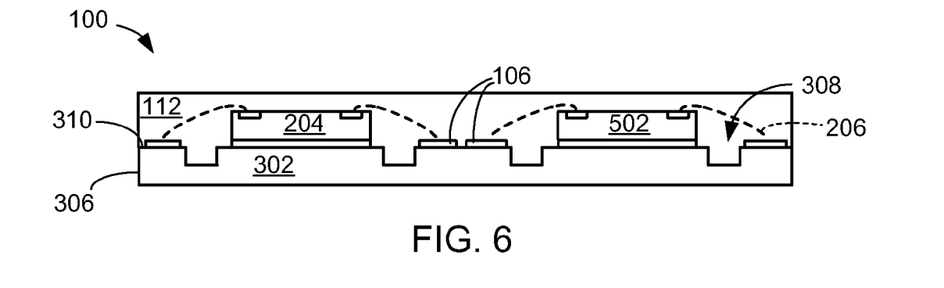
FIG. 6 is the structure of FIG. 5 in an encapsulation phase.

Referring now to FIG. 6, therein is shown the structure of FIG. 5 in an encapsulation phase. The insulating material 112 can be used to fill the cavities 308 located on the top surface 310 and applied over the stack die 204, the stack die 502, the interconnects 206 and the top surface 310 of the carrier 302. The side opposite the top surface 310 of the carrier 302 is exposed and free of the insulating material 112. The outer edges of the carrier 302 can optionally be exposed and free of the insulating material 112.

Figure 7:
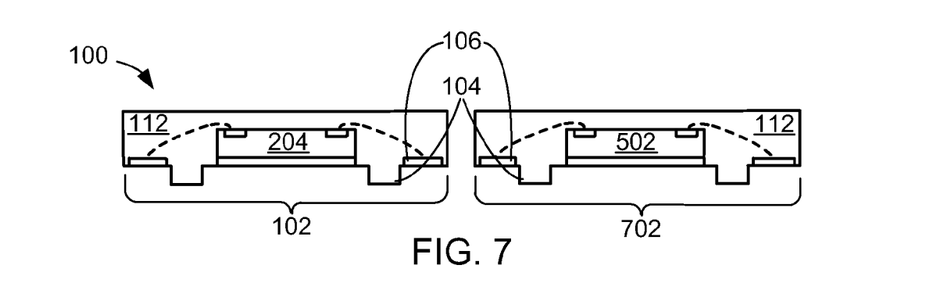
FIG. 7 is the structure of FIG. 6 in a singulation phase.

Referring now to FIG. 7, therein is shown the structure of FIG. 6 in a singulation phase. The singulation phase includes removal of the carrier 302 and formation of the stack module 102 covered with the insulating material 112 and an array module 702 covered with the insulating material 112 as a result of a bi-sectional cut at a location one-half the distance from an end of the pre-determined length of FIG. 3. The carrier 302 can be removed using a process such as an etching process or similar removal process suitable for the carrier material implemented resulting in the protruding supports 104 located adjacent the pads 106. The bi-sectional cut could be the result of a cutting, sawing, or similar singulation process suitable for the carrier material implemented.

It is noted that the array module 702, such as an internal stacking array module, can be an identical replica of the stack module 102 provided the array die 502 is identical in circuitry and connectivity with the circuitry and connectivity of the stack die 204. Also, the stack die 204 could be unique in circuitry or connectivity in comparison with the circuitry or connectivity of the array die 502 which would result in the stack module 102 having different functionality from the array module 702.

Figure 8:
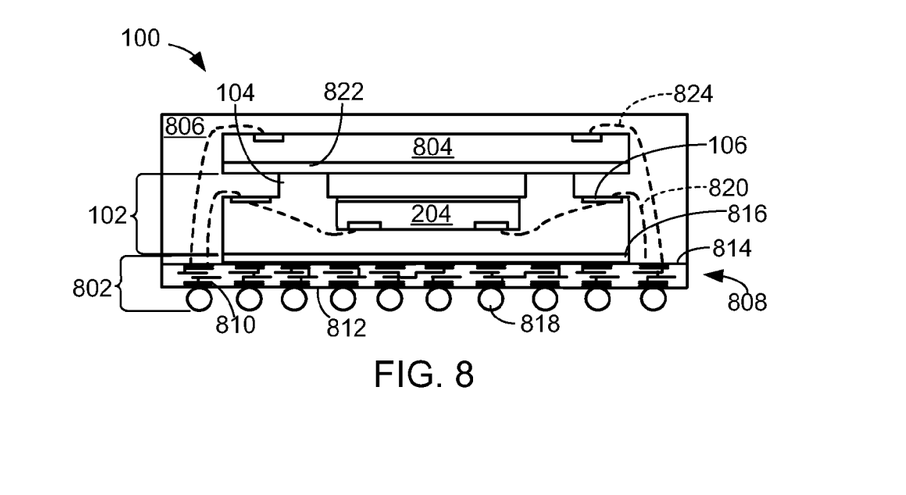
FIG. 8 is the structure of FIG. 2 in a stack integration phase.

Referring now to FIG. 8, therein is shown the structure of FIG. 2 in a stack integration phase. The integrated circuit package system 100 can preferably include a package base 802, the stack module 102, a top die 804, and a package encapsulant 806. The package base 802 can include a substrate 808 having conductors 810, such as bond pads, on a system surface 812 and on a component surface 814 located on a side opposite the system surface 812. The component surface 814 of the package base 802 can include an area having a base attachment layer 816 for the purposes of mounting the stack module 102.

Connectivity between the system surface 812, the component surface 814, and the conductors 810 can be provided by electrically conductive material located on and within the substrate 808, such as wire, multiple layers of trace, or similar functionally equivalent material. System connectors 818 such as solder balls can be used to provide connectivity between the package base 802 and a next level of system integration such a printed circuit board.

The surface of the stack module 102 opposite the surface having the protruding supports 104 can be attached on to the base attachment layer 816 of package base 802. Stack interconnects 820, such as bond wires, can provide connectivity between the pads 106 of the stack module 102 and the conductors 810 on the component surface 814 of the package base 802.

The top die 804 can be mounted onto the protruding supports 104 using a chip attachment layer 822 such as an epoxy or other functionally equivalent liquid or film adhesive. Top die interconnects 824, such as bond wires, solder balls, or similar electrical connectors, provide connectivity between circuitry of the top die 804 and the conductors 810 on the component surface 814 of the package base 802. The package encapsulant 806, such as an epoxy or material having similar protective properties can be applied over the component surface 814 of the package base 802, over the top die 804, and surround the top die interconnects 824, the stack interconnects 820, and the stack module 102.

The resulting integrated circuit package system 100, provides connectivity between the top die 804, the circuitry of the stack module 102, and a next level system.

It has been unexpectedly discovered that the protruding supports 104 eliminated the need for package spacers, resulting in enormous cost savings as well as improved structural rigidity preventing module warpage and providing precise solder ball height control.

Figure 9:
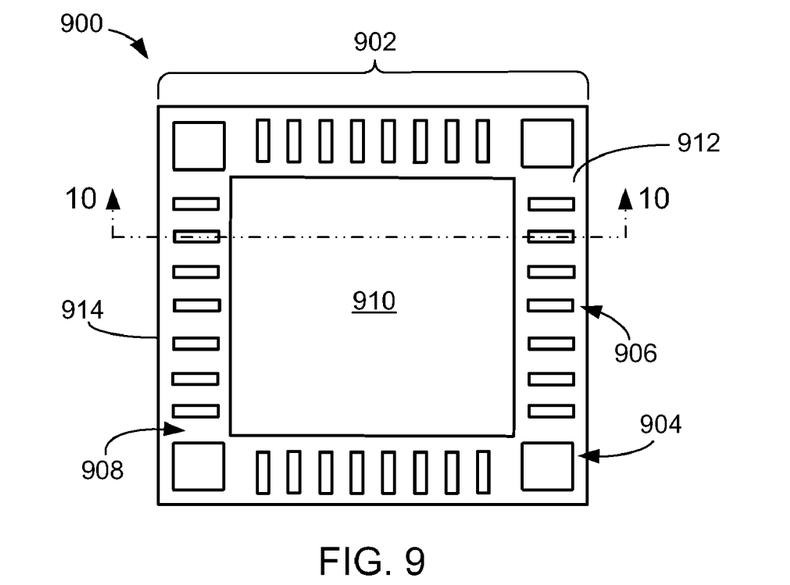
FIG. 9 is a top view of an integrated circuit package system in a second embodiment of the present invention.

Referring now to FIG. 9, therein is shown a top view of an integrated circuit package system 900 in a second embodiment of the present invention. The integrated circuit package system 900 can preferably include a stack module 902, such as an internal stacking module, having protruding supports 904, leads 906, a top surface 908, and an exposed die paddle 910. The stack module 902 can be rectangular in shape with the top surface 908 consisting of an insulating material 912 such as an encapsulant with the protruding supports 904 on the top surface 908.

The protruding supports 904 can be formed using the insulating material 912 or with material having similar structural and isolation properties. The leads 906, such as bonding pads, leads, or similar propertied material, can be located adjacent sides 914 of the stack module 902 and exposed adjacent the insulating material 912. The exposed die paddle 910, rectangular in shape, can be located centrally and exposed adjacent the insulating material 912 of the stack module 902.

The protruding supports 904 can be located adjacent each corner on the top surface 908 of the stack module 902. It is noted that the protruding supports 904 could optionally be located anywhere on the top surface 908 adjacent the leads 906 or the exposed die paddle 910. The protruding supports 904 are shown having a rectangular shape and it is noted the shape, the size, or the quantity of the protruding supports 904 are non-restrictive and can be modified based on end user product requirements.

Figure 10:
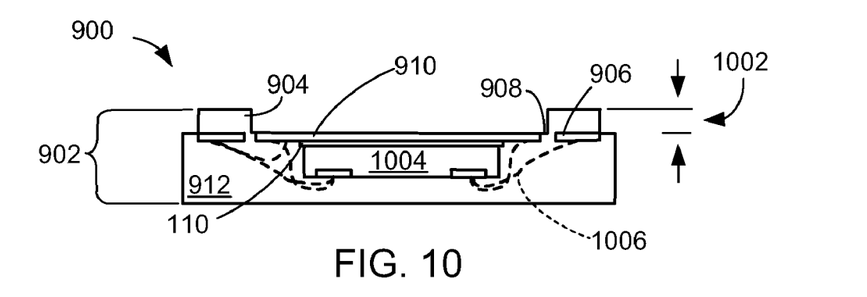
FIG. 10 is a cross-sectional view of the integrated circuit package system taken along a line 10-10 of FIG. 9.

Referring now to FIG. 10, therein is shown a cross-sectional view of the integrated circuit package system 900 taken along a line 10-10 of FIG. 9. The protruding supports 904 can be used to support and mount components such as devices or packages. The protruding supports 904 can be formed to rise a pre-determined vertical distance 1002 above the top surface 908 to accommodate clearance specific connectivity requirements, such as restrictive wire loop heights or solder heights, when connecting to any of the leads 906 on the stack module 902 or with any components mounted above the stack module 902.

Below the exposed die paddle 910, a stack die 1004 within the insulating material 912 can be mounted to the exposed die paddle 910 using the attachment layer 110. Connectivity between the circuitry of the stack die 1004 and the leads 906 can be provided with interconnects 1006 such as bond wires or similar electrical conductors located beneath the top surface 908. The interconnects 1006 can be used to connect the exposed die paddle 910 to the electrical grounds within the stack module 902 to improve electrical performance characteristics.

The stack module 902 can be incorporated into a next level of integration as one or part of a series of modules joined to form a single integrated circuit package.

Figure 11:
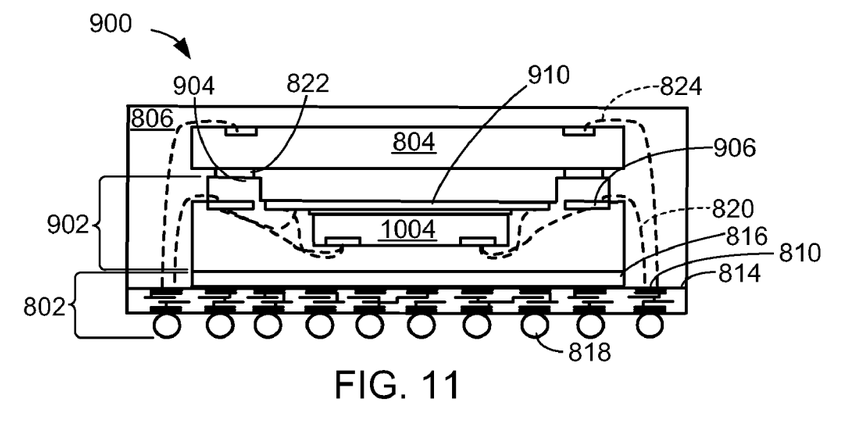
FIG. 11 is the structure of FIG. 10 in a stack integration phase.

Referring now to FIG. 11, therein is shown the structure of FIG. 10 in a stack integration phase. The integrated circuit package system 900 can preferably include the package base 802, the stack module 902, the top die 804, and the package encapsulant 806. The surface of the stack module 902 opposite the surface having the protruding supports 904 and the exposed die paddle 910 can be attached on to the base attachment layer 816 of package base 802. The stack interconnects 820 can provide connectivity between the leads 906 of the stack module 902 and the conductors 810 on the component surface 814 of the package base 802.

The chip attachment layer 822 can be applied onto the exposed end of each of the protruding supports 904 to provide attachment areas for the mounting of the top die 804. The top die interconnects 824 provide electrical connectivity between circuitry of the top die 804 and the conductors 810 on the component surface 814 of the package base 802. The package encapsulant 806, can be applied over the component surface 814 of the package base 802, over the top die 804, and surround the stack module 902, the top die interconnects 824, and the stack interconnects 820.

The system connectors 818 can provide electrical connectivity between the integrated circuit package system 900 and a next level system such as a printed circuit board.

It has been discovered that the reduction in usage of the chip attachment layer 822 due to having the attachment layer 822 applied only onto the exposed end of the protruding supports 904 results in significant cost savings.

Figure 12:
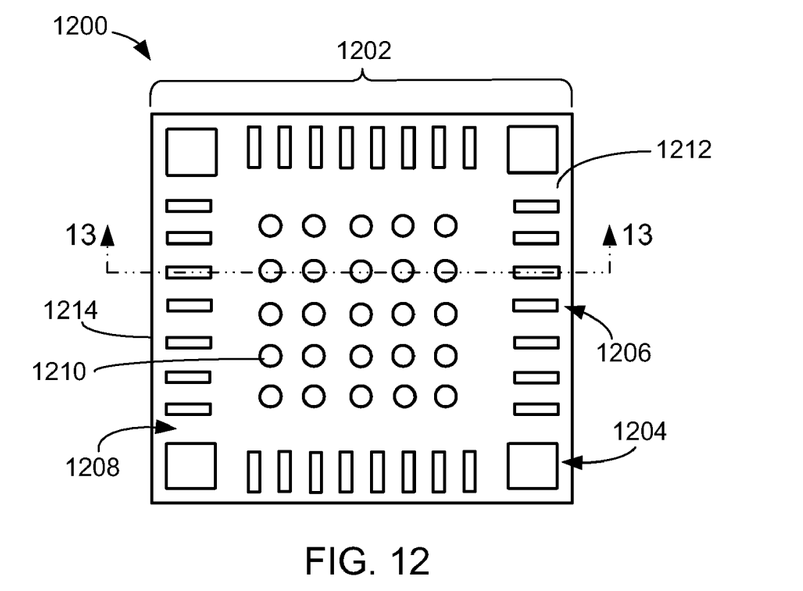
FIG. 12 is a top view of an integrated circuit package system in a third embodiment of the present invention.

Referring now to FIG. 12, therein is shown a top view of an integrated circuit package system 1200 in a third embodiment of the present invention. The integrated circuit package system 1200 can preferably include a stack module 1202, such as an internal stacking module, having protruding supports 1204, pads 1206, a top surface 1208, and exposed contacts 1210, such as solder wettable pads. The stack module 1202 can be rectangular in shape with the top surface 1208 consisting of an insulating material 1212 such as an encapsulant with the protruding supports 1204 on the top surface 1208.

The pads 1206, such as bonding pads, leads, or similar propertied material, can be located adjacent sides 1214 of the stack module 1202 and exposed adjacent the insulating material 1212. The exposed contacts 1210, individually circular in shape, can be located centrally and distributed in a rectangular grid array pattern. The exposed contacts 1210 can be exposed adjacent the insulating material 1212 of the stack module 1202. The individual size, shape, location, or distribution of the exposed contacts 1210 is non-restrictive and can be modified based on end user product requirements.

The protruding supports 1204 can be formed using the insulating material 1212 or any other material having similar structural and isolation properties. The protruding supports 1204 can be located adjacent each corner on the top surface 1208 of the stack module 1202. It is noted that the protruding supports 1204 could optionally be located anywhere on the top surface 1208 adjacent the pads 1206 or the exposed contacts 1210. The protruding supports 1204 are shown having a rectangular shape and it is noted the shape, the size, or the quantity of the protruding supports 1204 are non-restrictive and can be modified based on end user product requirements.

Figure 13:
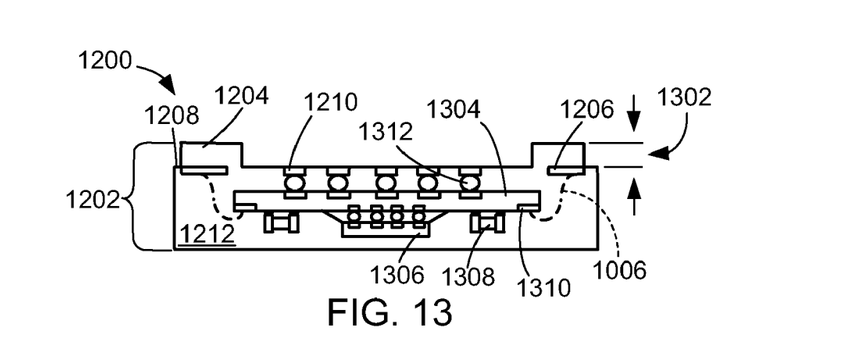
FIG. 13 is a cross-sectional view of the integrated circuit package system taken along a line 13-13 of FIG. 12.

Referring now to FIG. 13, therein is shown a cross-sectional view of the integrated circuit package system 1200 taken along a line 13-13 of FIG. 12. The protruding supports 1204 can be used to support and mount components such as devices or packages. The protruding supports 1204 can be formed to rise a pre-determined vertical distance 1302 above the top surface 1208 to accommodate clearance specific connectivity requirements, such as restrictive wire loop heights or solder heights, when connecting to any of the pads 1206 on the stack module 1202 or with any components mounted above the stack module 1202.

A circuit board 1304 having a stack die 1306, such as a package with solder bumps, discrete components 1308, and interconnect pads 1310 can be mounted below the exposed contacts 1210. The interconnect pads 1310 on a side of the circuit board 1304 can be attached to the surface of the exposed contacts 1210 opposite the surface exposed adjacent the insulating material 1212 of the exposed contacts 1210 to provide connectivity between the circuit board 1304 and the exposed contacts 1210 using board interconnects 1312.

The circuit board 1304, the stack die 1306, the discrete components 1308, and the interconnect pads 1310 can be imbedded within the insulating material 1212 of the stack module 1202. The circuit board 1304 can contain conductive trace material, such as copper, aluminum, or trace material having similar properties, used to provide connectivity between the stack die 1306, the discrete components 1308, and the interconnect pads 1310.

The interconnects 1006 can be used to provide connectivity between the circuit board 1304 and the pads 1206 of the stack module 1202. The stack module 1202 can be pre-tested prior to integration into a next level of integration as one or part of a series of modules joined to form a single integrated circuit package.

Figure 14:
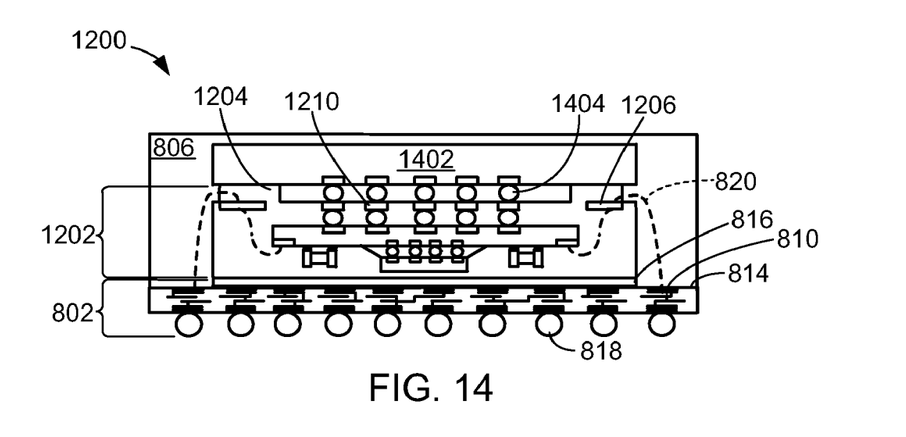
FIG. 14 is the structure of FIG. 13 in a stack integration phase.

Referring now to FIG. 14, therein is shown the structure of FIG. 13 in a stack integration phase. The integrated circuit package system 1200 can preferably include the package base 802, the stack module 1202, a top die 1402 having top die interconnects 1404, such as bond wires, solder balls, or similar electrical connectors, and the package encapsulant 806. The surface of the stack module 1202 opposite the surface having the protruding supports 1204 can be attached on to the base attachment layer 816 of package base 802. The stack interconnects 820 can provide electrical connectivity between the pads 1206 of the stack module 1202 and the conductors 810 on the component surface 814 of the package base 802.

The circuitry of the top die 1402 can have electrical connectivity to the stack module 1202 by attaching the top die interconnects 1404 onto the exposed contacts 1210 of the stack module 1202. The protruding supports 1204 of the stack module 1202 can be used to support the top die 1402 during the manufacturing of the integrated circuit package system 1200 by providing pre-determined gap clearance for the top die interconnects 1404. The protruding supports 1204 also can provide a pre-determined planar relationship between surfaces of the top die 1402 and the stack module 1202 as well as addressing other process related requirements.

The package encapsulant 806, can be applied over the component surface 814 of the package base 802, over the top die 1402, and surround the stack module 1202, the top die interconnects 824, and the stack interconnects 820. The system connectors 818 can provide connectivity between the integrated circuit package system 1200 and a next level system such as a printed circuit board.

Figure 15:
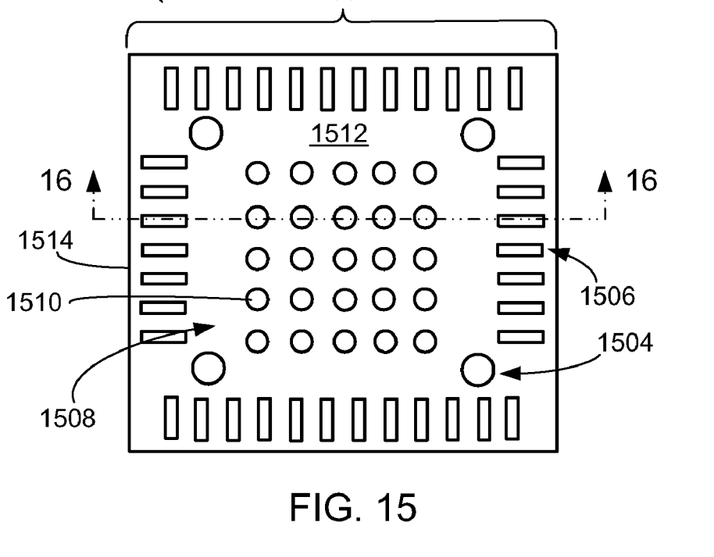
FIG. 15 is a top view of an integrated circuit package system in a fourth embodiment of the present invention.

Referring now to FIG. 15, therein is shown a top view of an integrated circuit package system 1500 in a fourth embodiment of the present invention. The integrated circuit package system 1500 can preferably include a stack module 1502, such as an internal stacking module, having protruding supports 1504, pads 1506, a top surface 1508, and exposed contacts 1510, such as solder wettable pads. The stack module 1502 can be rectangular in shape with the top surface 1508 consisting of an insulating layer 1512 used to protect conductive material located below the top surface 1508.

The pads 1506, such as bonding pads, leads, or similar propertied material, can be located adjacent sides 1514 of the stack module 1502 and exposed adjacent the insulating layer 1512. The exposed contacts 1510, individually circular in shape, can be located centrally and distributed in a rectangular grid array pattern. The exposed contacts 1510 can be exposed adjacent the insulating layer 1512 of the stack module 1502. The individual size, shape, location, or distribution of the exposed contacts 1510 is non-restrictive and can be modified based on end user product requirements.

The protruding supports 1504 can be located at a predetermined distance from each corner of the stack module 1502 and surrounded by the insulating layer 1512 on the top surface 1508. It is noted that the protruding supports 1504 could optionally be located anywhere on the top surface 1508 adjacent the pads 1506 or the exposed contacts 1510. The protruding supports 1504 are shown having a circular shape and it is noted the shape, the size, or the quantity of the protruding supports 1504 are non-restrictive and can be modified based on end user product requirements.

Figure 16:
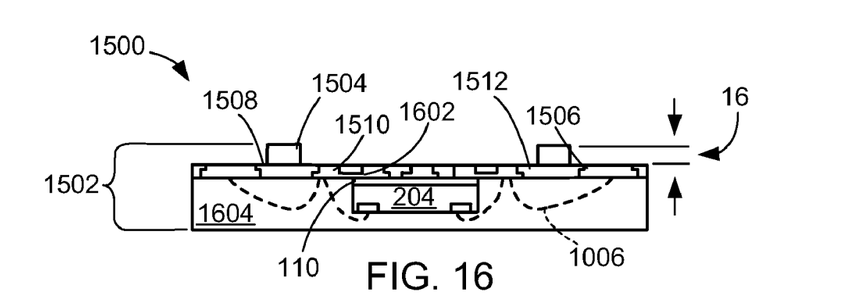
FIG. 16 is a cross-sectional view of the integrated circuit package system taken along a line 16-16 of FIG. 15.

Referring now to FIG. 16, therein is shown a cross-sectional view of the integrated circuit package system 1500 taken along a line 16-16 of FIG. 15. Located below the exposed contacts 1510 adjacent the insulating layer 1512 on the top surface 1508 is a routing layer 1602 consisting of conductive material such as copper or other conductive material having similar properties. The exposed contacts 1510 can be formed on the routing layer 1602 and can include conductive material such as copper, gold, or other conductive material having similar properties.

The stack die 204 can be attached below the routing layer 1602 located under the exposed contacts 1510 using the attachment layer 110. The interconnects 1006 can be connected between the routing layer 1602 and the circuitry of the stack die 204 or the pads 1506 providing connectivity between the stack die 204, the routing layer 1602, and the pads 1506. An insulating material 1604 such as an encapsulant can be applied over the stack die 204, the interconnects 1006, and the surface of the routing layer 1602 opposite the routing layer 1602 surface adjacent the top surface 1508.

The protruding supports 1504 can be formed from the insulating material 1604 or any other material having similar structural and isolation properties. The protruding supports 1504 can extend from within the insulating material 1604, through the insulating layer 1512, and extend above the top surface 1508. The protruding supports 1504 rise a pre-determined vertical distance 1606 above the top surface 1208 to accommodate clearance specific connectivity requirements, such as restrictive wire loop heights or solder heights, when connecting to any of the pads 1506 on the stack module 1502 or with any components mounted above the stack module 1502.

The stack module 1502 can be further incorporated into a next level of integration as one or part of a series of modules joined to form a single integrated circuit package.

Figure 17:
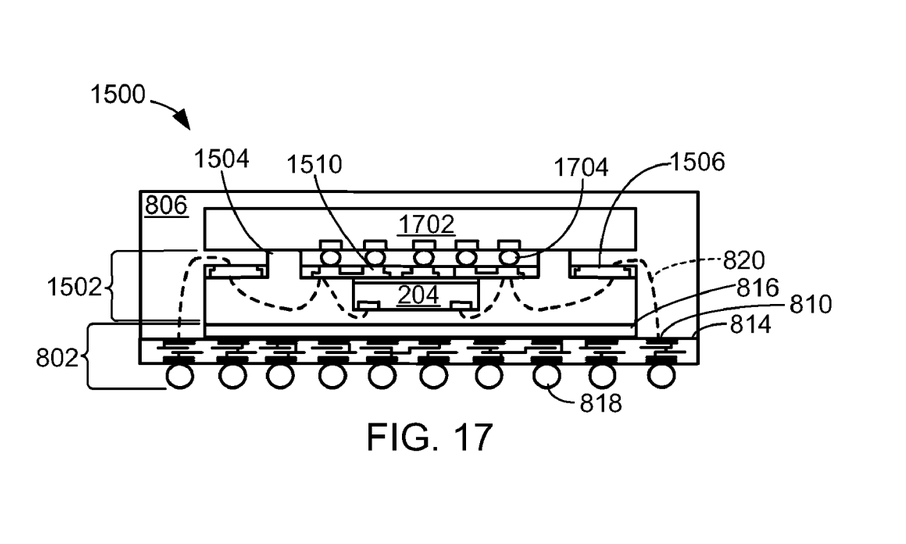
FIG. 17 is the structure of FIG. 16 in a stack integration phase.

Referring now to FIG. 17, therein is shown the structure of FIG. 16 in a stack integration phase. The integrated circuit package system 1500 can preferably include the package base 802, the stack module 1502, a top die 1702 having top die interconnects 1704, such as bond wires, solder balls, or similar electrical connectors, and the package encapsulant 806. The surface of the stack module 1502 opposite the surface having the protruding supports 1504 can be attached on to the base attachment layer 816 of package base 802. The stack interconnects 820 can provide electrical connectivity between the pads 1506 of the stack module 1502 and the conductors 810 on the component surface 814 of the package base 802.

The circuitry of the top die 1702 can have electrical connectivity to the stack module 1502 by attaching the top die interconnects 1704 onto the exposed contacts 1510 of the stack module 1502. The protruding supports 1504 of the stack module 1502 can be used to support the top die 1702 during the manufacturing of the integrated circuit package system 1500 by providing pre-determined gap clearance for the top die interconnects 1704. The protruding supports 1504 also can provide a pre-determined planar relationship between surfaces of the top die 1702 and the stack module 1502 as well as addressing other process related requirements.

The package encapsulant 806, can be applied over the component surface 814 of the package base 802, over the top die 1702, and surround the stack module 1502, the top die interconnects 824, and the stack interconnects 820. The system connectors 818 can provide connectivity between the integrated circuit package system 1500 and a next level system such as a printed circuit board.

Figure 18:
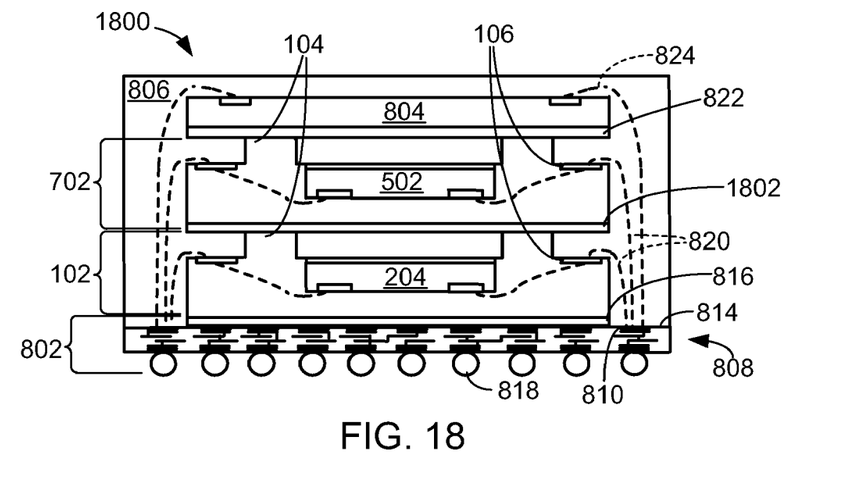
FIG. 18 is a cross-sectional view of an integrated circuit package system in a fifth embodiment of the present invention.

Referring now to FIG. 18, therein is shown a cross-sectional view of an integrated circuit package system 1800 in a fifth embodiment of the present invention. The integrated circuit package system 1800 can preferably include the package base 802, the stack module 102, the array module 702, the top die 804, and the package encapsulant 806.

The surface of the stack module 102 opposite the surface having the protruding supports 104 of the stack module 102 can be attached on to the base attachment layer 816 of package base 802. The stack interconnects 820 can provide electrical connectivity between the pads 106 of the stack module 102 and the conductors 810 on the component surface 814 of the package base 802.

The surface of the array module 702 opposite the surface having the protruding supports 104 of the array module 702 can be attached on to the protruding supports 104 of the stack module 102 using a stack attachment layer 1802. The stack interconnects 820 can be used to provide electrical connectivity between the pads 106 of the array module 702 and the conductors 810 on the component surface 814 of the package base 802

The chip attachment layer 822 can be applied onto the exposed end of each of the protruding supports 104 of the array module 702 to provide attachment areas for the mounting of the top die 804. The top die interconnects 824 provide electrical connectivity between circuitry of the top die 804 and the conductors 810 on the component surface 814 of the package base 802. The package encapsulant 806, can be applied over the component surface 814 of the package base

802, over the top die 804, and surround the stack module 102, the array module 702, the top die interconnects 824, and the stack interconnects 820.

The system connectors 818 can provide connectivity between the integrated circuit package system 1800 and a next level system such as a printed circuit board.

Figure 19:
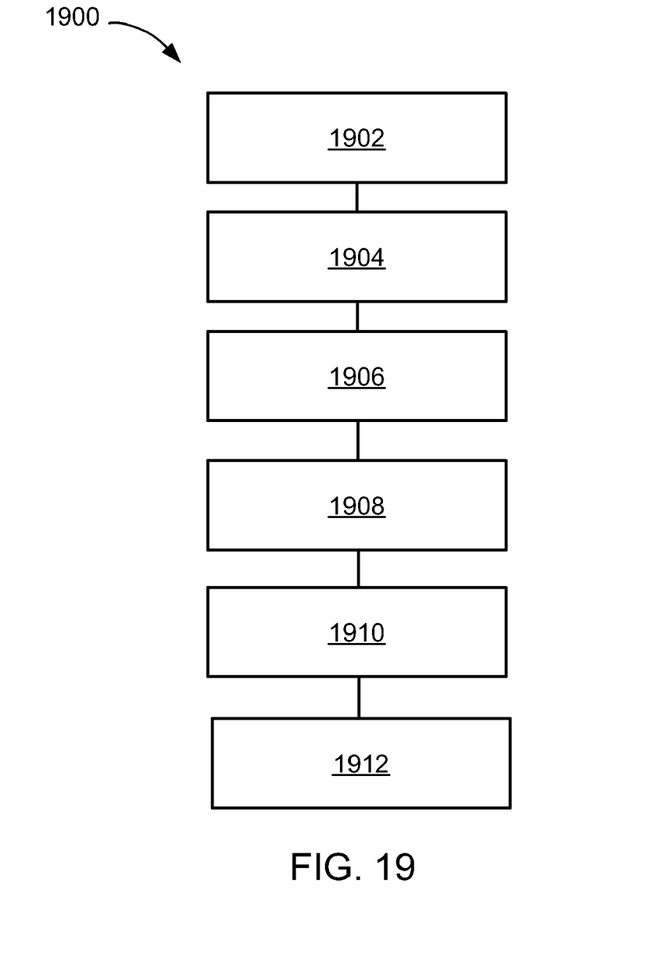
FIG. 19 is shown a flow chart of an integrated circuit package system for manufacturing the integrated circuit package system in an embodiment of the present invention.

Referring now to FIG. 19, therein is shown a flow chart of an integrated circuit package system 1900 for manufacturing the integrated circuit package system 100 in an embodiment of the present invention. The system 1900 includes forming a stack module including: providing a stack die, and encapsulating the stack die with an insulating material having a protruding support and a pad connected to the stack die in a block 1902; mounting the stack module on a package base in a block 1904; connecting the pad to the package base in a block 1906; mounting a top die on the protruding support in a block 1908; connecting the top die to the package base in a block 1910; and encapsulating the top die, the package base, and the stack module with a package encapsulant in a block 1912.

In greater detail, a system to provide the method and apparatus of the integrated circuit package system 100, in an embodiment of the present invention, is performed as follows:

1. Forming an internal stacking module including: providing a stack die, and encapsulating the stack die with an insulating material having a protruding support and a pad connected to the stack die.
2. Providing a package base having a component surface.
3. Mounting the internal stacking module on the component surface.
4. Connecting a stack interconnect between the pad and the component surface.
5. Mounting a top die on the protruding support.
6. Connecting a top die interconnect between the top die and the component surface.
7. Applying a package encapsulant over the top die, over the component surface, and adjacent the internal stacking module, the stack interconnect and the top die interconnect.

Thus, it has been found that the integrated circuit package system method and apparatus of the present invention furnish important and heretofore unknown and unavailable solutions, capabilities, and functional aspects. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. An integrated circuit package system comprising:
  forming a stack module including:
    providing a stack die,
    encapsulating the stack die with an insulating material having a protruding support and a pad connected to the stack die;
    providing a routing layer,
    connecting the stack die to the routing layer,
    encapsulating the routing layer and the stack die with the insulating material having the protruding support and the pad and an exposed contact connected to the routing layer; and
  further comprising:
    mounting the stack module on a package base;
    connecting the pad to the package base;
    mounting a top die on the protruding support, supported with the protruding support;
    connecting the top die to the exposed contact;
    connecting the top die to the package base; and
    encapsulating the top die, the package base, and the stack module with a package encapsulant.

2. The system as claimed in claim 1 wherein:
  forming the stack module includes:
    providing an exposed die paddle,
    attaching the stack die to the exposed die paddle, and
    encapsulating the stack die with the insulating material having the protruding support and the pad connected to the stack die or the exposed die paddle.

3. The system as claimed in claim 1 wherein:
  forming the stack module includes:
    providing a circuit board,
    connecting a discrete component to the circuit board,
    connecting the stack die to the circuit board,
    connecting the circuit board to the pad and the exposed contact,
    encapsulating the circuit board, the stack die, and the discrete component with the insulating material having the protruding support and the pad and the exposed contact connected to the circuit board; and
  further comprising:
    connecting the top die to the exposed contact; and
    supporting the top die with the protruding support.

4. The system as claimed in claim 1 further comprising:
  forming an array module including:
    providing an array die,
    encapsulating the array die with an insulating material having another protruding support and another pad connected to the array die; and
  further comprising:
    mounting the array module on the stack module;
    connecting the pad of the array module to the package base;
    mounting the top die on the protruding support of the array module; and
    encapsulating the top die, the package base, the array module, and the stack module with the package encapsulant.

5. An integrated circuit package system comprising:
  forming an internal stacking module including:
    providing a stack die,
    encapsulating the stack die with an insulating material having a protruding support and a pad connected to the stack die;
    providing an exposed die paddle,
    attaching the stack die to the exposed die paddle,
    connecting the stack die to the exposed die paddle,
    encapsulating the stack die with the insulating material having the protruding support and the pad connected to the stack die or the exposed die paddle; and
  further comprising:
    providing a package base having a component surface;
    mounting the internal stacking module on the component surface;
    connecting a stack interconnect between the pad and the component surface;

mounting a top die on the protruding support;
connecting a top die interconnect between the top die and the component surface; and
applying a package encapsulant over the top die, over the component surface, and adjacent the internal stacking module, the stack interconnect and the top die interconnect.

6. The system as claimed in claim 5 wherein:
forming the internal stacking module includes:
providing a circuit board,
connecting a discrete component to the circuit board,
connecting the stack die to the circuit board,
connecting the pad to the circuit board,
providing an exposed contact,
connecting a board interconnect between the circuit board and the exposed contact,
encapsulating the circuit board, the stack die, and the discrete component with the insulating material having the protruding support, the pad connected to the circuit board, and the exposed contact adjacent the insulating material; and
further comprising:
connecting the top die to the exposed contact; and
supporting the top die with the protruding support.

7. The system as claimed in claim 5 wherein:
forming the internal stacking module includes:
providing a routing layer having an exposed contact,
connecting the stack die to the routing layer,
connecting the pad to the routing layer,
encapsulating the routing layer and the stack die with the insulating material having the protruding support, and the exposed contact adjacent the insulating material; and
further comprising:
connecting the top die to the exposed contact; and
supporting the top die with the protruding support.

8. The system as claimed in claim 5 further comprising:
forming an internal stacking array module including:
providing an array die,
encapsulating the array die with an insulating material having another of the protruding support and another of the pad connected to the array die; and
further comprising:
mounting the internal stacking array module on the internal stack module;
connecting another of the stack interconnect between the pad of the internal stacking array module and the component surface;
mounting the top die on the protruding support of the internal stacking array module; and
applying the package encapsulant over the top die, over the component surface, and adjacent the internal stacking array module, the internal stacking module, the stack interconnect and the top die interconnect.

9. An integrated circuit package system comprising:
a stack module including:
a stack die,
the stack die encapsulated with an insulating material having a protruding support and a pad connected to the stack die;
a routing layer,
the stack die connected to the routing layer,
the routing layer and the stack die encapsulated with the insulating material having the protruding support and the pad and an exposed contact connected to the routing layer; and further comprising:
the stack module mounted on a package base;
the pad connected to the package base;
a top die connected to the package base;
the top die connected to the exposed contact;
the top die supported with the protruding support; and
the top die, the package base, and the stack module encapsulated with a package encapsulant.

10. The system as claimed in claim 9 wherein:
the stack module includes:
an exposed die paddle,
the stack die attached to the exposed die paddle, and
the stack die encapsulated with the insulating material having the protruding support and the pad connected to the stack die or the exposed die paddle.

11. The system as claimed in claim 9 wherein:
the stack module includes:
a circuit board,
a discrete component connected the circuit board,
the stack die connected to the circuit board,
the circuit board connected to the pad and the exposed contact,
the circuit board, the stack die, and the discrete component encapsulated with the insulating material having the protruding support and the pad and the exposed contact connected to the circuit board; and
wherein:
the top die is connected to the exposed contact; and
the top die is supported with the protruding support.

12. The system as claimed in claim 9 further comprising:
an array module including:
an array die,
the array die encapsulated with an insulating material having another protruding support and another pad connected to the array die; and
further comprising:
the array module mounted on the stack module;
the pad of the array module connected to the package base;
the top die mounted on the protruding support of the array module; and
the top die, the package base, the array module, and the stack module encapsulated with the package encapsulant.

13. The system as claimed in claim 9 wherein:
the stack module is an internal stacking module;
the package base has a component surface;
the internal stacking module is mounted on the component surface;
the pad and the component surface are connected with a stack interconnect therebetween;
the top die is mounted on the protruding support;
the top die and the component surface have a top die interconnect connected therebetween; and
the package encapsulant is applied over the component surface, and adjacent the internal stacking module, the stack interconnect and the top die interconnect.

14. The system as claimed in claim 13 wherein:
the internal stacking stack module includes:
an exposed die paddle,
the stack die attached to the exposed die paddle,
the stack die connected to the exposed die paddle, and
the stack die encapsulated with the insulating material having the protruding support and the pad connected to the stack die or the exposed die paddle.

15. The system as claimed in claim 13 wherein:
the internal stacking module includes:
- a circuit board,
- a discrete component connected to the circuit board,
- the stack die connected to the circuit board,
- the pad connected to the circuit board,
- the exposed contact,
- a board interconnect connected between the circuit board and the exposed contact,
- the circuit board, the stack die, and the discrete component encapsulated with the insulating material having the protruding support, the pad connected to the circuit board, and the exposed contact adjacent the insulating material; and wherein:
- the top die is connected to the exposed contact; and
- the top die is supported with the protruding support.

16. The system as claimed in claim 13 further comprising:
an internal stacking array module includes:
- an array die,
- the array die encapsulated with an insulating material having another of the protruding support and another of the pad connected to the array die; and further comprising:
- the internal stacking array module mounted on the internal stack module;
- another of the stack interconnect connected between the pad of the internal stacking array module and the component surface;
- the top die mounted on the protruding support of the internal stacking array module; and
- the package encapsulant applied over the top die, over the component surface, and adjacent the internal stacking array module, the internal stacking module, the stack interconnect and the top die interconnect.

* * * * *